(12) United States Patent
Cheng

(10) Patent No.: US 6,639,407 B1
(45) Date of Patent: Oct. 28, 2003

(54) CHARGING/DISCHARGING ELECTRICAL ENERGY INDICATION APPARATUS AND ELECTRICAL ENERGY CALCULATION METHOD FOR USE IN THE APPARATUS

(75) Inventor: Chiu-Hao Cheng, Miaoli Hsien (TW)

(73) Assignee: Zeroplus Technology Co., Ltd., Chungho (TW)

( * ) Notice: Subject to any disclaimer, the term of this patent is extended or adjusted under 35 U.S.C. 154(b) by 0 days.

(21) Appl. No.: 10/206,224

(22) Filed: Jul. 29, 2002

(51) Int. Cl.$^7$ .............................................. G01N 27/416
(52) U.S. Cl. ....................... 324/428; 320/132
(58) Field of Search ............................... 320/127, 128, 320/132, 149; 324/427, 428, 433

(56) References Cited

U.S. PATENT DOCUMENTS 5,206,578 A * 4/1993 Nor
5,606,242 A * 2/1997 Hull et al.
5,955,869 A * 9/1999 Rathmann

* cited by examiner

Primary Examiner—Edward H. Tso
(74) Attorney, Agent, or Firm—Bacon & Thomas PLLC

(57) ABSTRACT

A charging/discharging electrical energy indication apparatus and electrical energy calculation method in which charging/discharging current and end voltage of the battery are sampled at a fixed cycle, and then the electrical energy value of every charging/discharging sampling is calculated subject to $W=(P0+P1)T/2$, and then the charging/discharging electrical energy of the battery is continuously added or deducted, and displayed by digits.

10 Claims, 5 Drawing Sheets

CHARGING/DISCHARGING ELECTRICAL ENERGY INDICATION APPARATUS AND ELECTRICAL ENERGY CALCULATION METHOD FOR USE IN THE APPARATUS

BACKGROUND OF THE INVENTION

1. Field of the Invention

The present invention relates to a charging/discharging electrical energy indication apparatus and, more particularly, to such a charging/discharging electrical energy indication apparatus and its indication method that accurately calculates the amount of electrical power of the storage battery, and indications the result by digits. The invention relates also to an electrical power calculation method for use in the charging/discharging electrical energy indication apparatus.

2. Description of the Related Art

Following fast development of high-tech, a variety of mobile high-tech products including notebook computers, mobile telephones, CD players, PDAs, VCD players, and etc. have been disclosed and have appeared on the market. These mobile electronic apparatus commonly use storage battery to provide the necessary working voltage. In order to prevent data loss due to power low, a mobile electronic apparatus generally has means to detect and indication the residual electrical power of the equipped storage battery. However, the indication of the battery power of regular mobile electronic apparatus is simply a rough indication expressed by percentage or step but not an accurate indication expressed by digits.

Further, when charging a battery with a conventional battery charger, the battery chargers does not show the amount charged or the residual amount of electrical power of the battery. According to conventional techniques, the charging methods of conventional battery chargers include:

1. Constant voltage charging method: According to this method, the battery charger provides the battery with a constant voltage power source, i.e., the charging current is automatically stopped when the battery charged to the voltage level of the constant voltage power source.
2. Constant current charging method: This method is superior to the constant voltage charging method because it provides the battery with stabilized current. However, the cost of the charging circuit is relatively high because the charging circuit must be provided with a voltage detecting circuit that cuts off charging power when the end voltage of the battery reached the rated voltage value.
3. Pulse charging method: This method uses pulse power to charge the battery, activating the chemical characteristics of the battery and prolonging the service life of the battery.

A battery charger made subject to either of the aforesaid methods stops charging the battery subject to the condition that the end voltage of the battery reached the rated voltage value, i.e., the charging procedure is stopped when the end voltage of the battery reached the rated voltage value. However, because the initial voltage value is unknown, the actual amount of charging power entered the battery at each charging action is unknown. Because the actual condition of the battery is unknown, the user may not take the necessary battery discharging action, or may charge the battery that is not necessary to be charged. Because regular battery chargers cannot indicate the amount of electrical power of the battery when charging, the user may neglect "battery aging" or "battery memory effect".

SUMMARY OF THE INVENTION

The present invention has been accomplished under the circumstances in view. It is therefore the main object of the present invention to provide a charging/discharging electrical energy indication apparatus that accurately calculates the amount of electrical power of the battery. It is another object of the present invention to provide a charging/discharging electrical energy indication apparatus that indicates the residual amount of electrical power of the battery when charging. It is still another object of the present invention to provide a charging/discharging electrical energy indication apparatus that indicates the accumulated amount of electrical power of the battery when charging. To achieve these and other objects of the present invention, the electrical energy calculation method is to sample charging/discharging current and end voltage of the battery at a fixed cycle, and then to calculate the electrical energy value of every charging/discharging sampling subject to $W=(P0+P1)T/2$. By means of continuously adding or deducting the electrical energy value of every charging/discharging sampling, the charging electrical energy of the battery is obtained and displayed by digits. The method is used in a charging/discharging electrical energy indication apparatus, enabling the user to know the charging amount of electrical energy at every charging action for reference. Therefore, the user knows when to discharge the battery. When the invention used in an electronic apparatus, the user can accurately known the charging power and consumption power of the battery at every charging action,

DETAILED DESCRIPTION OF THE PREFERRED EMBODIMENT

Figure 1:
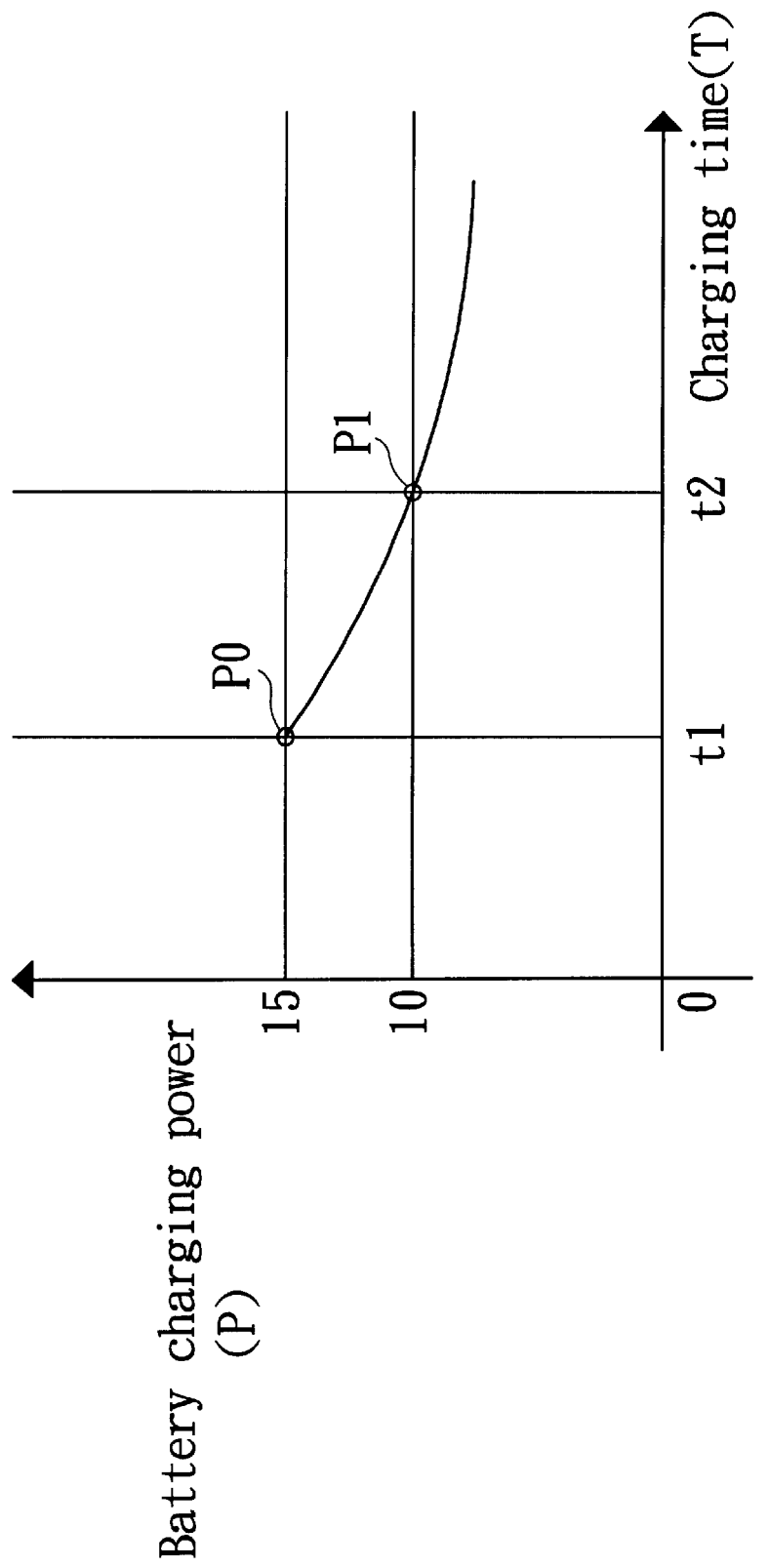
FIG. 1 is a charging power vs charging time characteristic curve of a battery.

FIG. 1 is a charging power vs charging time characteristic curve of a battery. In a charging action to charge a battery with a battery charger, the charging power obtained by the battery is gradually reducing with the charging time, i.e., the charging power is not maintained constant. This condition happens due to the factors of current battery temperature, battery material, battery aging.

According to electrical energy calculation formula $W=PT$, power P is a constant value within time T. The formula of $W=PT$ cannot be directly used to calculate the charging electrical energy of a battery within a time T because the charging power P within time T is not a constant value. Based on this formula, the electrical energy W cannot be accurately calculated.

According to the charging/discharging electrical energy indication method of the present invention, the charging power of the battery is calculated by gradually adding or deducting the electrical power P0 and P1 obtained from sampling voltage and sampling current within sampling time T0, i.e., $W=(P0+P1)T0/2$.

Assume sampling cycle $T0=0.01$ second, the charging current of the battery $I=1$ mA, and the end voltage of the battery at t1 and t2 are V0=3V and V1=2.9V, thus the charging electrical energy W at the sampling time when calculated by $\mu W$ W=(P0+P1)T0/2; P=VI
W=[10−3(3+2.9)/2](0.01/3600)
W=0.00081947 $\mu W$/hour Therefore, within the charging/discharging time of the battery and according to the electrical power calculation method of the present invention, the continuous charging electrical energy or discharging electrical energy of the battery is the result gradually added or deducted of sampled electrical energy.

Figure 2:
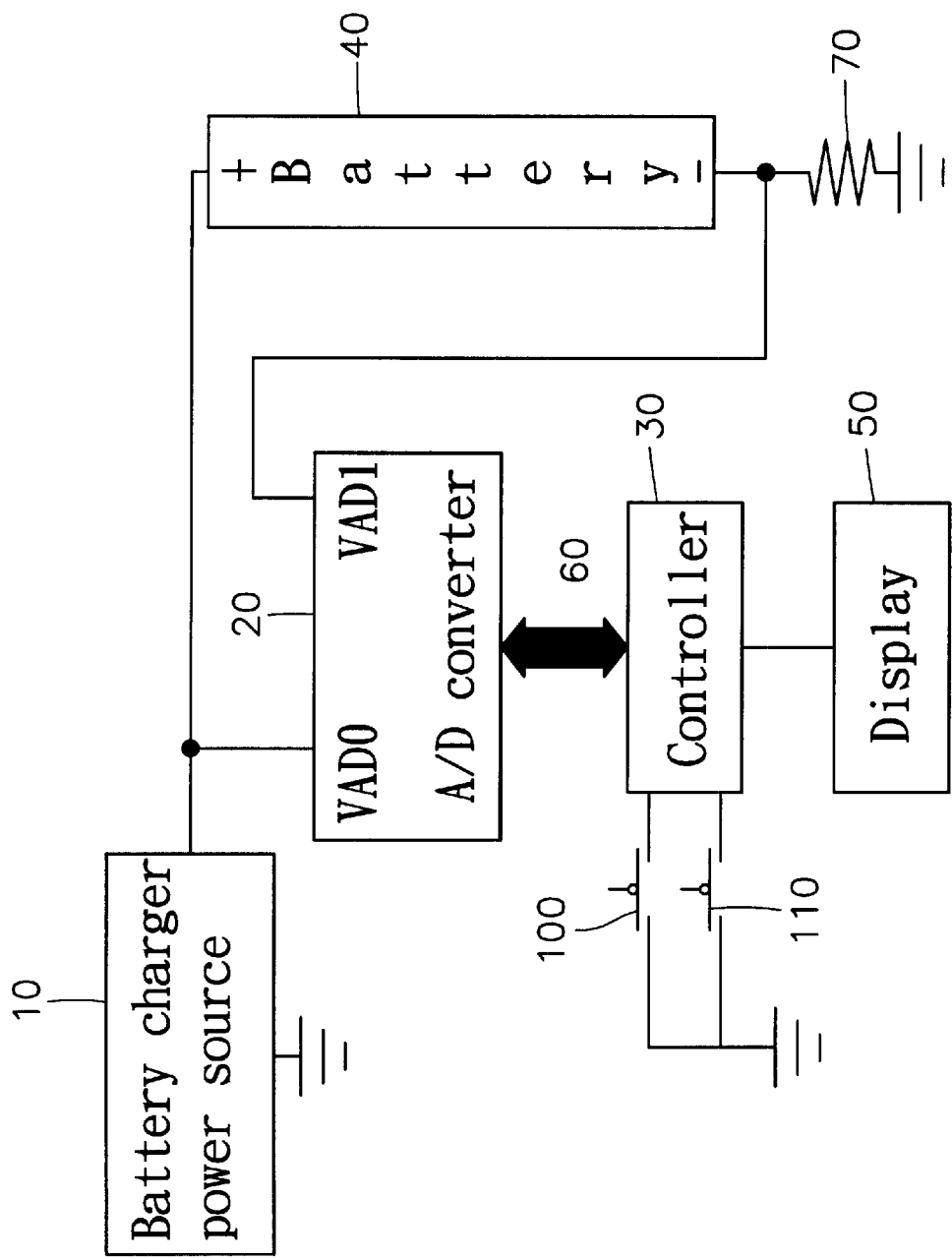
FIG. 2 is a circuit block diagram of a charging/discharging electrical energy indication apparatus and a battery charging/discharging loop according to the present invention.

Referring to FIG. 2, battery charger power source 10 can be constant voltage source or constant current source, which provides charging electrical energy to the battery 40. According to this first embodiment of the present invention, the charging/discharging electrical energy indication apparatus comprises a converter 20, a controller 30, and a display 50. The converter 20 is an A/D converter connected in series to the battery 40 through a resistor 70, and adapted to directly sample end voltages VAD0 and VAD1 from the battery 40 and to convert sampled end voltages VAD0 and VAD1 into digital signal. The output digital signal of the converter 20 is sent through a data bus 60 to the controller 30.

The controller 30 obtains digital data of end voltages VAD0 and VAD1 through the data bus 60, and run a calculation and judging procedure. When the battery 40 set into the battery seat of the battery charger, it forms with the battery charger a charging/discharging loop, enabling the controller 30 to obtain the values of end voltages VAD0 and VAD1 within a fixed sampling cycle, to judge the charging/discharging action of the battery charger, and to calculate the electrical power of the battery 40. At the same time, the controller 30 outputs calculation result to the display 50 for display.

Figure 3:
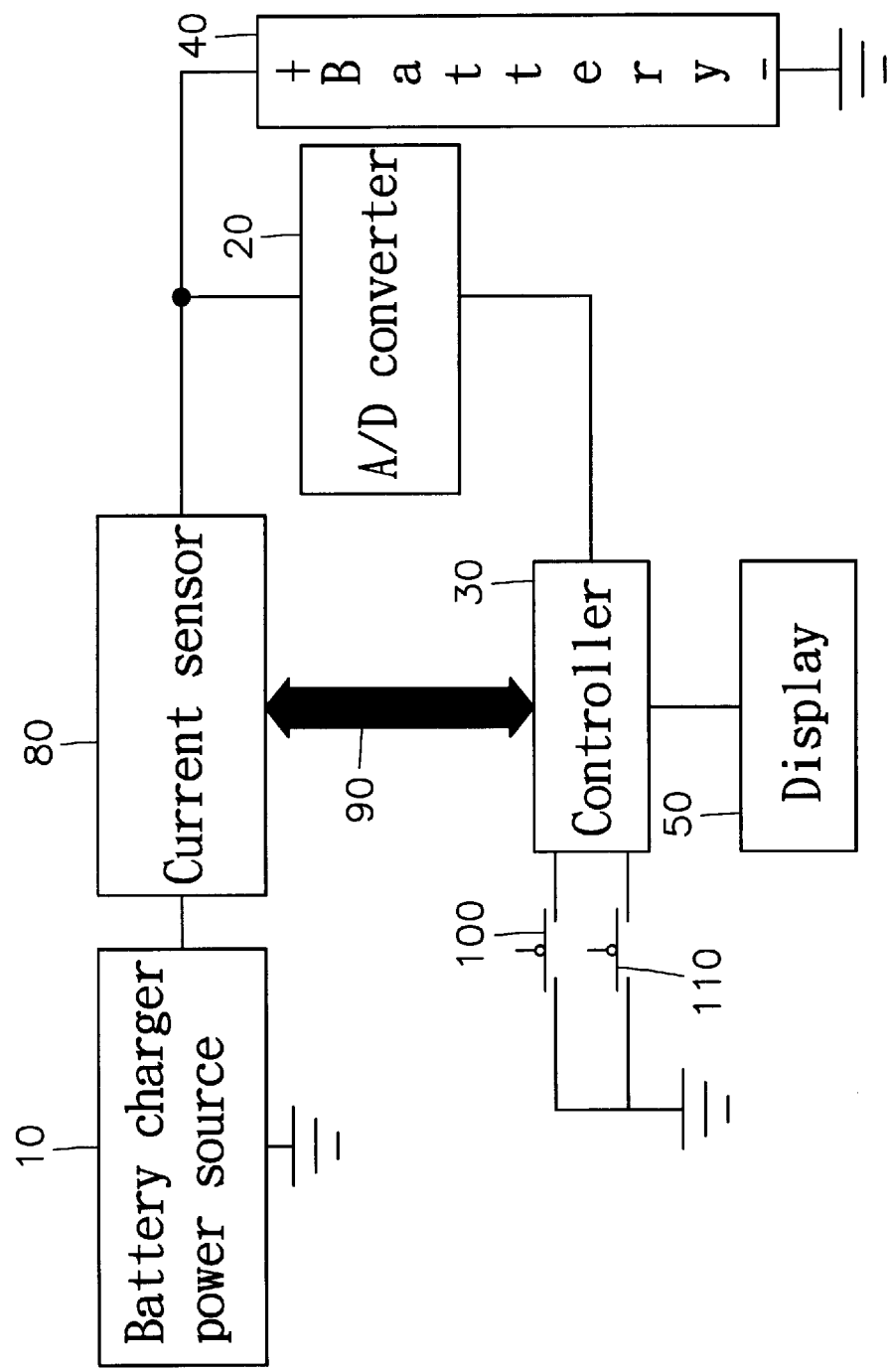
FIG. 3 is a circuit block diagram of an alternate form of the present invention.

FIG. 3 shows an alternate form of the present invention. According to this second embodiment, the charging/discharging electrical energy indication apparatus comprises a converter 20, a controller 30, and a display 50. The converter 20 is an A/D converter adapted to convert end voltages of the battery 40. The converter 20 is connected in series to the battery charging/discharging loop through a current sensor 80. The current sensor 80 is connected to the controller 30 through a data bus 90 to provide the controller 30 with the charging/discharging current value of the battery 40.

The controller 30 obtains sampled end voltage and current data from the battery 40 through the current sensor 80 and the A/D converter, and then runs a calculation and judging procedure. When he battery 40 set into the battery seat of the battery charger, it forms with the battery charger a charging/discharging loop, enabling the controller 30 to obtain the end voltage data and charging/discharging current data within a fixed sampling cycle, to judge the charging/discharging action of the battery charger, and to calculate the electrical energy of the battery 40. At the same time, the controller 30 outputs calculation result to the display 50 for display. According to this embodiment, the current sensor 80 can be obtained from National Semiconductor product IC numbers. LM3822 and LM3824 for the advantage of high current detection accuracy ±1A within 2%, PWM accurately outputs current value and current direction, and ease of connection to the controller 30.

In the embodiments shown in FIGS. 2 and 3, a switching switch 100 and a reset 110 may be used and connected to the controller 30. The controller 30 detects the action of the switching switch 100 that determines the display mode of the display 50. For example, when continuously switching the switching switch 100, the controller 30 drives the display 50 to display voltage value, current value, and electrical power value in proper order. Further, the controller 30 detects the action of the reset 110. When the reset witch 110 switched on, the value of charging/discharging energy is zeroed. The display 50 can provide a menu for enabling the user to elect the desired content, for example, displaying electrical energy value, voltage value, and current value by digits.

Figure 4:
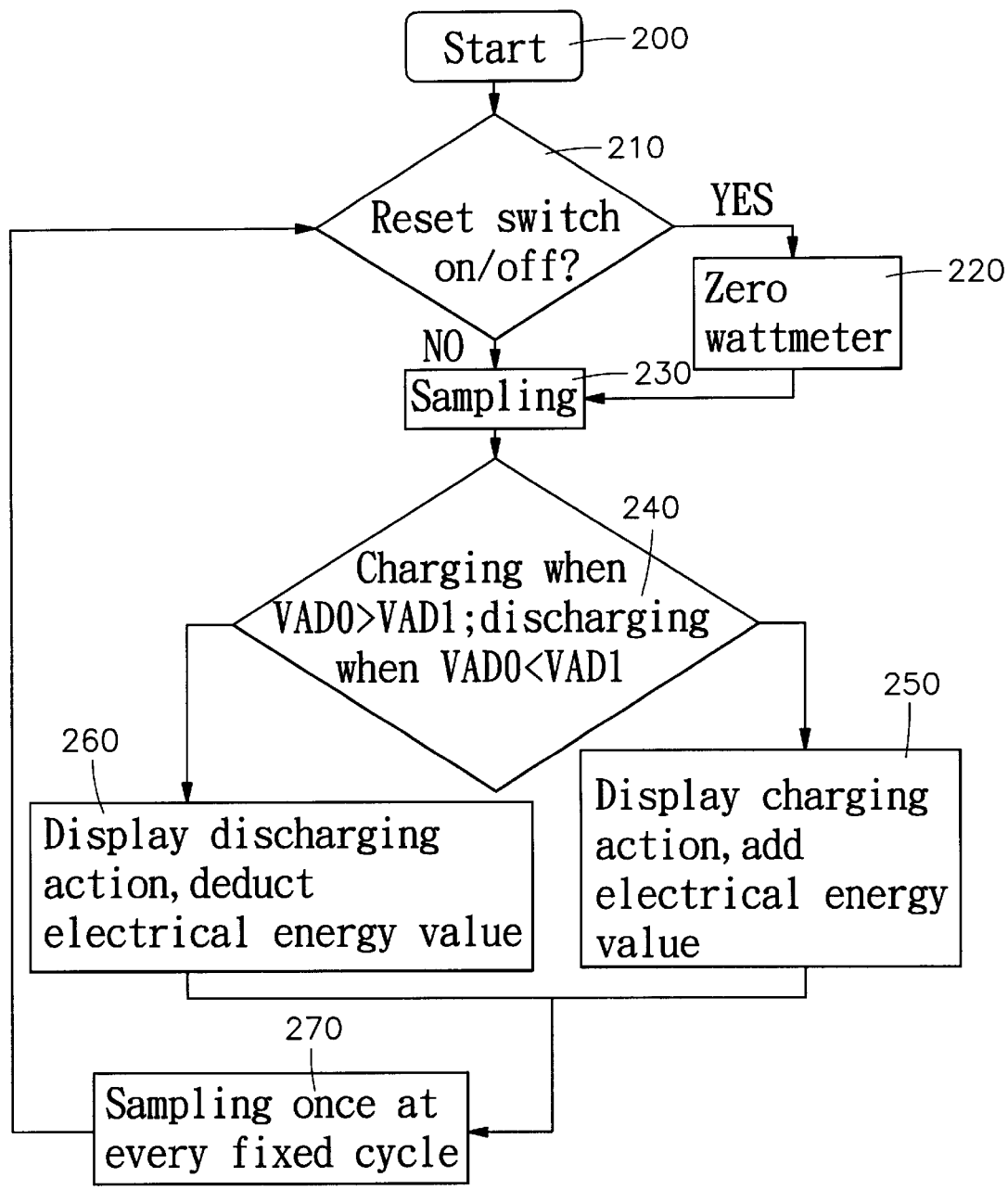
FIG. 4 is a charging/discharging power indication flow chart according to the present invention.

Referring to FIG. 4, the calculation and judging procedure of the controller 30 includes the steps of:

Step 210: Detect reset switch 110 in action or not; if yes, proceed to step 220, if not, proceed to step 230;

Step 220: Reset calculated electrical power value;

Step 230: Sample voltage and current values from charging/discharging loop;

In the embodiment shown in FIG. 2, the converter 20 converts voltages VAD0 and VAD1 to obtain voltage of battery charger and end voltages of battery; in the embodiment shown in FIG. 3, end voltage values and charging/discharging current value are obtained through the current sensor 80 and the converter 20.

Step 240: Charging/discharging judgment.

In the embodiment shown in FIG. 2, when VAD0>VAD1, it means that the battery charger is charging the battery, thus proceed to step 250; when VAD0<VAD1, it means that the battery charger is discharging the battery, thus proceed to step 260;

In the embodiment shown in FIG. 3, it defines the positive current direction of the current sensor 80 to be the battery charging mode, thus proceed to step 250; on the contrary, it defines the negative current direction of the current sensor 80 to be the battery discharging mode, thus proceed to step 260.

Step 250: Control the display 50 to display the charging message of the battery, and then proceed to step 270 after adding calculation of sampled electrical power. According to the embodiment shown in FIG. 2, each sampling action obtains charging current VAD1/R and battery end voltage VAD0−VAD1, and the sampled electrical power is obtained by means of the calculation of W=(P0+P1)T0/2, and the sum of the calculation is the accumulated electrical energy value of the battery. Further, in the embodiment shown in FIG. 2, every sampling positive current direction is the charging current and battery end voltages. According to W=(P0+P1)T0/2, the electrical power value P1 of current sampling is obtained and added to the electrical power value P0 of last sampling, so as to obtain the accumulated electrical energy value of the battery.

Step 260: Control the display to display the discharging message of the battery, and then proceed to step 270 after deducted the currently sampled electrical power value. In the embodiment shown in FIG. 2, each sampling obtains discharging current VAD1/R and battery end voltage VAD1−VAD0, and the sampled electrical power is obtained by means of the calculation of W=(P0+P1)T0/2, and the sum of the calculation is the discharged electrical energy value of the battery.

Step 270: Delay a sampling cycle T0, and then return to step 210.

When the user resets the reset switch 110, the controller 30 zeroes the reading of charging/discharging energy value, and runs the aforesaid calculation and judging procedure.

Therefore, the controller 30 controls the display 50 to show the sum of accumulated electrical energy. The sum displayed on the display 50 is the sum of electrical energy continuously discharged from the battery. Therefore, the user can accurately monitor the charging/discharging status of the battery.

Figure 5:
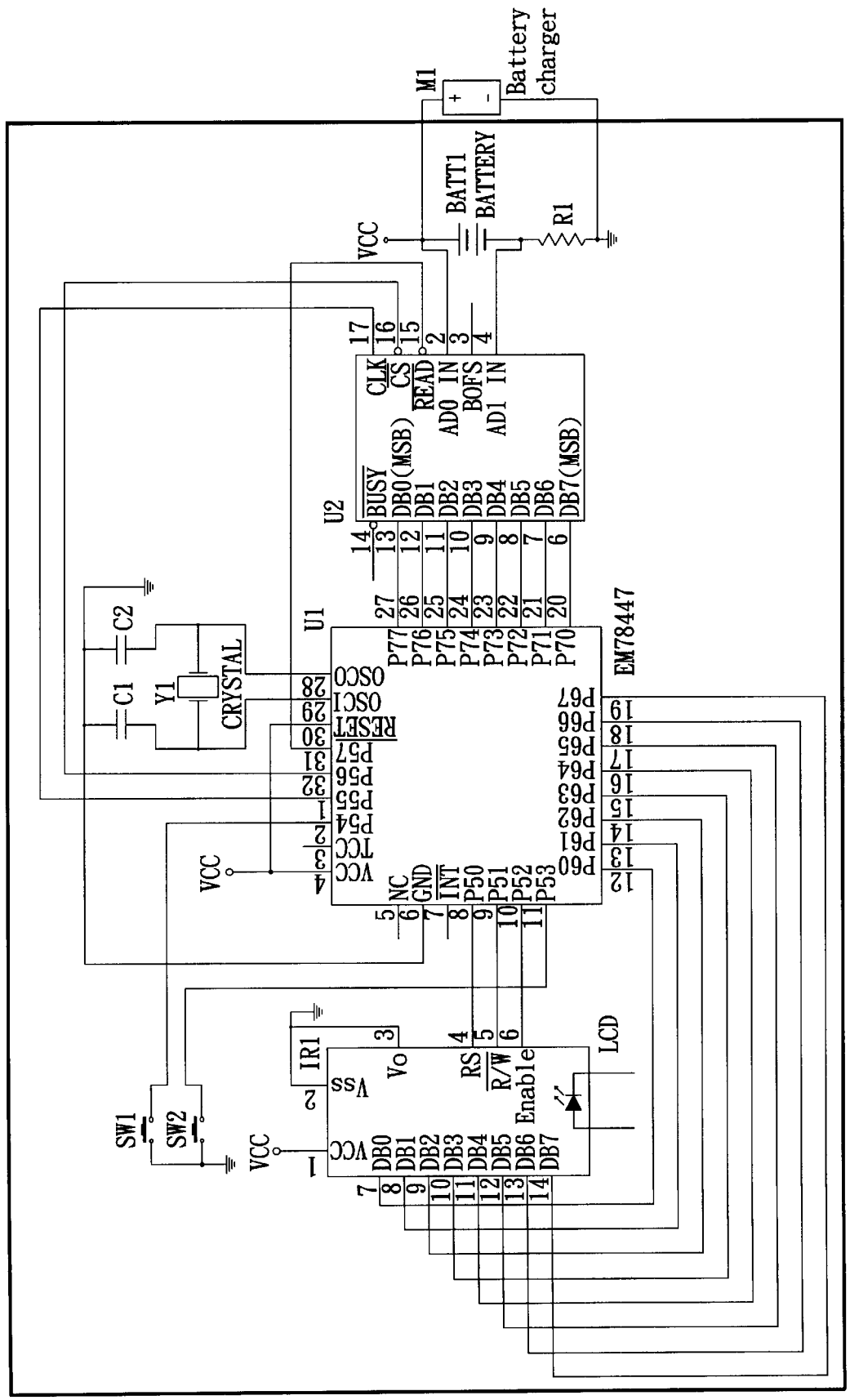
FIG. 5 is a circuit diagram of the charging/discharging electrical energy indication apparatus according to the present invention.

FIG. 5 is a circuit diagram of the charging/discharging electrical energy indication apparatus according to the present invention. As illustrated, the controller 30 is an IC number U1 EM78447, which is a common program controller electrically connected to multiple push button switches SW1 and SW2 to detect the respective potential change. The push button switches SW1 and SW2 are the aforesaid switching switch 100 and reset switch 110. The IC U1 EM78447 is programmed to run the calculation and judging procedure as indicated in FIG. 4. The IC U2 embodies the aforesaid A/D converter 20 to obtain end voltages from the battery 40. Further, the reference number IR1 is a LCD embodying the aforesaid display 50. The reference number M1 indicates the battery charger power source 10. According to this embodiment, the A/D converter 20 directly sample end voltages of the battery 40, therefore during step 250 and step 260 the controller 30 calculates the end voltages of the battery 40 to be VAD0−VAD1 or VAD1−VAD0, the current to be VAD1/R1; subject to W=(P0+P1)T0/2, the current sampling electrical power value is calculated and the calculation result is shown on the LCD 50.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A charging/discharging electrical energy indication apparatus comprised a converter, a controller and a display, and electrically connected to the charging/discharging loop of a battery for indicating the electrical charging/discharging power of the battery, wherein said controller obtains end voltages of said battery and current value of said charging/discharging loop within a sampling cycle to calculate the electrical power value, and drives said display to display the sum of electrical energy value continuously accumulated within said sampling cycle.

2. The charging/discharging electrical energy indication apparatus as claimed in claim 1, wherein said electrical power value is the product of the end voltage values of said battery by the current value of said charging/discharging loop; said electrical energy value calculated during said sampling cycle is the product of said sampling cycle by said electrical power value; when said controller judged said battery to be under charging, said controller continuously counts the electrical power value of every sampling cycle.

3. The charging/discharging electrical energy indication apparatus as claimed in claim 1, wherein said electrical power value is the product of the end voltage values of said battery by the current value of said charging/discharging loop; said electrical energy value calculated during said sampling cycle is the product of said sampling cycle by said electrical power value; when said controller judged said battery to be under discharging, said controller continuously deduct the electrical power value of every sampling cycle.

4. The charging/discharging electrical energy indication apparatus as claimed in claim 1, further comprising a switching switch connected to said controller such that said controller controls the display mode of said display subject to the position of said switching switch.

5. The charging/discharging electrical energy indication apparatus as claimed in claim 1, further comprising a reset switch connected to said controller such that said controller zeroes the counting upon action of said reset switch.

6. The charging/discharging electrical energy indication apparatus as claimed in claim 1, which is installed in a battery charger.

7. The charging/discharging electrical energy indication apparatus as claimed in claim 1, which is installed in an electronic apparatus.

8. The charging/discharging electrical energy indication apparatus as claimed in claim 1, which is installed in a battery.

9. An electrical energy calculation method used to calculate the electrical power value of a battery in a charging/discharging loop, the method comprising the steps of:

(a) sampling the end voltage value of said battery and the current value of said charging/discharging loop within a sampling cycle;

(b) calculating the average electrical power value obtained during said sampling cycle; and (c) accumulating the electrical energy value, which is the product of said sampling cycle by said average electrical power value.

10. The electrical energy calculation method as claimed in claim 9, wherein said electrical power value is the product of said voltage value and said current value.

* * * * *